United States Patent [19]

Lebby et al.

[11] Patent Number: 5,748,161
[45] Date of Patent: *May 5, 1998

[54] INTEGRATED ELECTRO-OPTICAL PACKAGE WITH INDEPENDENT MENU BAR

[75] Inventors: Michael S. Lebby, Apache Junction; Ronald J. Nelson, Scottsdale, both of Ariz.

[73] Assignee: Motorola, Inc., Schaumburg, Ill.

[*] Notice: The term of this patent shall not extend beyond the expiration date of Pat. No. 5,432,358.

[21] Appl. No.: 610,533

[22] Filed: Mar. 4, 1996

[51] Int. Cl.[6] .................................................. G09G 3/34
[52] U.S. Cl. ............................ 345/84; 257/81; 257/88
[58] Field of Search ............................ 345/84; 257/81, 257/88, 98, 99, 72, 432

[56] References Cited

U.S. PATENT DOCUMENTS

| | | | |
|---|---|---|---|
| 5,432,358 | 7/1995 | Nelson et al. | 257/81 |
| 5,612,549 | 3/1997 | Nelson et al. | 257/88 |
| 5,625,201 | 4/1997 | Holm et al. | 257/88 |

Primary Examiner—Amare Mengistu
Attorney, Agent, or Firm—Eugene A. Parsons

[57] ABSTRACT

An integrated electro-optical package (50) including a first light emitting device (LED) display chip (28) and at least one additional LED display chip (30), each composed of an optically transparent substrate (10) with an array (15) of LEDs (12) formed thereon and cooperating to generate a complete image. The LEDs (12) of the first LED display chip (28) are constructed to emit light of a wavelength different than the light emitted by the additional LED display chip(s) (30), thereby creating a different color menu or object bar (156) within the view (150) generated. A mounting substrate (25), having connection pads (32), bump bonded to the pads on the optically transparent substrate (10). A driver substrate (55) having connections to the pads (32) on the mounting substrate (25). A plurality of driver and control circuits (57) connected to the LED display chips (28) and (30) through electrodes on the driver substrate (55). A lens (73) in alignment with the LED display chips (28) and (30) to magnify the complete images and produce an easily viewable virtual image.

33 Claims, 10 Drawing Sheets

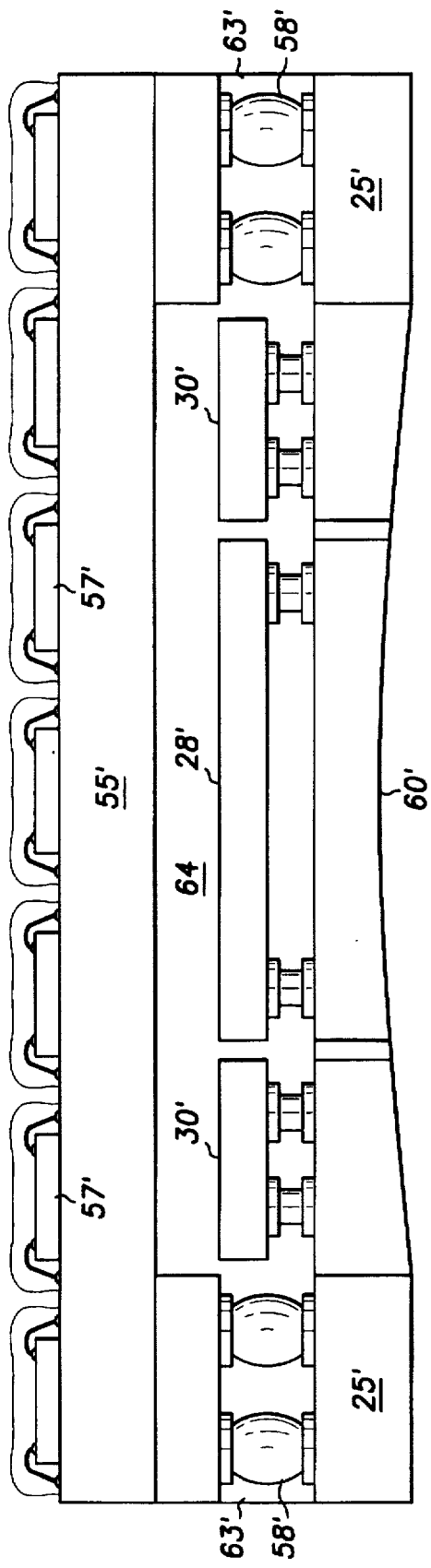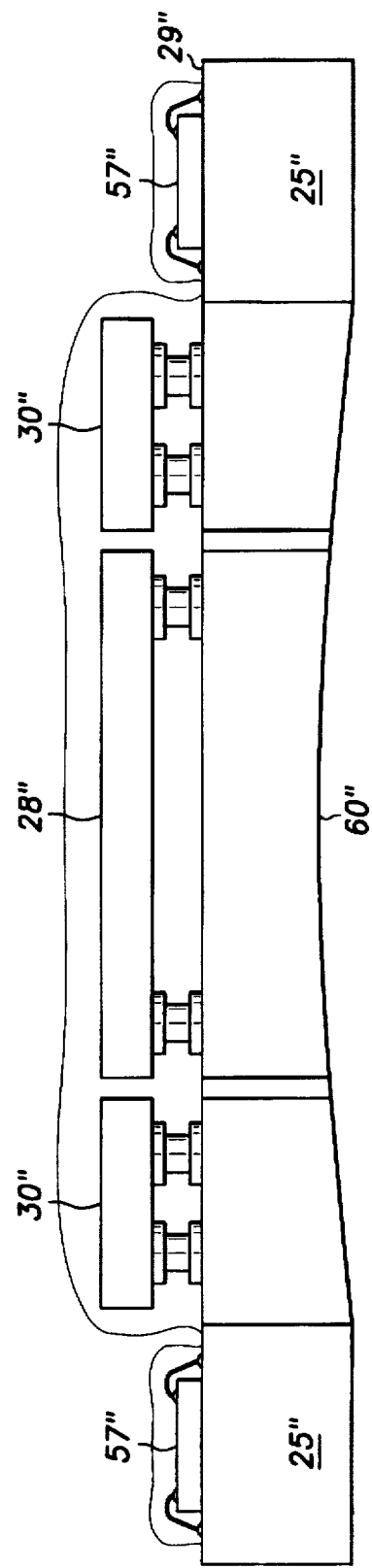

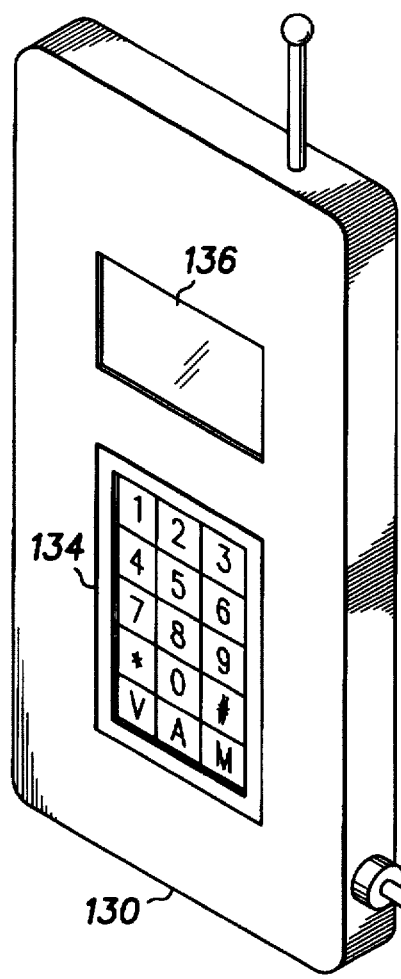
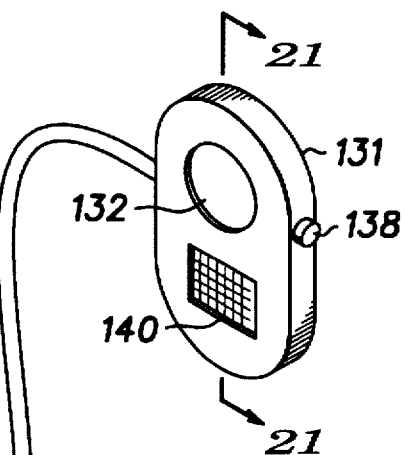
FIG. 20
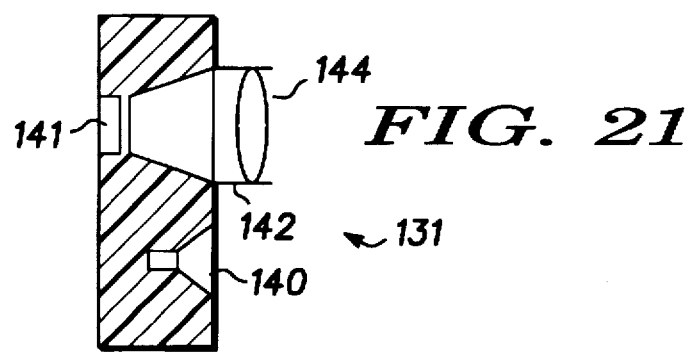
FIG. 21

INTEGRATED ELECTRO-OPTICAL PACKAGE WITH INDEPENDENT MENU BAR

FIELD OF THE INVENTION

The present invention pertains to packages containing electrical and optical components connected in cooperation and more specifically to a package for electrically connecting a plurality of display arrays, optical components and driver circuits in electrical circuitry.

BACKGROUND OF THE INVENTION

At the present time, because of the surge in the popularity of communication and visual devices, there are many applications for image manifestation apparatus. With this surge in popularity there exist a great need for devices incorporating the ability to display direct view images and/or virtual images that utilize electro-optical packages formed having a display module that contains an array of light emitting devices (LEDs).

LEDs have been fabricated in arrays including large numbers of LEDs and utilized in image generation apparatus to produce virtual images. One problem with the arrays of LEDs utilized in this apparatus is the fact that only a single display image of a single color can be obtained. In an original device, the electro-optical package utilized was only capable of incorporating a single light emitting device imager (LEDI) chip, composed of a 2-D array of visible LEDs, such that the LEDs, interconnects, and control circuitry were fabricated onto a single gallium arsenide (GaAs) based semiconductor chip. The light emitting device display was only capable of emitting red light so that the images generated were red and relatively difficult to see. In later models an orange or amber color LED was utilized but the image was still a single color.

In creating these types of devices, or image manifestation apparatus, there exist the need to incorporate more functional displays. This is achieved by utilizing a plurality of light emitting device display chips formed of display arrays in a plurality of colors that are capable of producing images that include the functionality of different colors. A plurality of colors are desired so the image generated will include an easily identifiable control menu or object bar. In addition, the image manifestation apparatus needs to incorporate lower manufacturing costs, simpler assembly and be amenable to high volume production.

Generally, two types of light emitting devices are known: the edge emitting device, which is utilized almost exclusively in conjunction with fiber optics; and the surface emitting devices.

The surface emitting, light emitting devices (LEDs) are popular devices utilized for emitting light to produce images. Surface emitting LEDs require a very small area (5-50 μms) and are relatively easy to fabricate. Thus, surface emitting LEDs can be fabricated in large addressable arrays so that complete images can be generated by a single array incorporated into a light emitting device display chip.

One feature of surface emitting LEDs is the fact that they are a one predominant wavelength device. As previously stated, at the present time there is a need to incorporate into an image manifestation apparatus that generates a display image, the use of more than one color as a means for identifying controlling functions such as a menu or object bar within the display, for use when viewing a miniature virtual image. Specifically, desired is to include a menu or object bar of a contrasting color that is easily identifiable by the user of the apparatus and can be used with various controlling functions.

Thus, it would be highly desirable to provide for an electro-optical package containing a plurality of display modules, or light emitting device display chips, for creating at least a dual color image within the complete images generated when viewed as a virtual image, thereby providing for a main display and a control menu or object bar, while maintaining the size limitation on interconnect and overall packaging structures.

Accordingly, it is a purpose of the present invention to provide integrated electro-optical packages that allow for the integration of a menu or object bar within the complete image displayed when viewed as a virtual image.

It is a further purpose of the present invention to incorporate at least two independent light emitting device display chips, each containing an array of light emitting devices of a wavelength different than the other light emitting device display chip, into an image manifestation apparatus, thereby providing for a multi-color combined image which is not limited in size by the electrical connections.

It is another purpose of the present invention to provide an integrated electro-optical package which contains overall substantially greater numbers of LEDs of at least two different wavelengths than previous integrated packages.

It is still another purpose of the present invention to provide an integrated electro-optical package, capable of generating complete images of at least two contrasting colors, that is substantially simpler to assemble, amenable to high volume production and less costly to manufacture.

SUMMARY OF THE INVENTION

The above problems and others are substantially solved and the above purposes and others are realized in an integrated electro-optical package including a means for altering the visual functionality of a display by incorporating a plurality of visual displays within the packaging of an electro-optical package. Specifically, what is disclosed is to provide a means for controlling or manipulating the images displayed through the use of a task oriented color menu or object bar achieved by a separate light emitting device display chip composed of an array that emits light of a different wavelength than that of the main light emitting device display chip.

The electro-optical package of the present invention is composed of a first major light emitting device display chip having of an LED array created to emit light of a first wavelength and a second additional light emitting device display chip, or a plurality of additional light emitting device display chips, composed of LED arrays constructed to emit light of a wavelength, different than the first wavelength of light emitted by the first light emitting device display chip, each of the complete images formed by the LED arrays, together creating a multi-color combined complete image, that in the preferred embodiment includes an identifiable menu or object bar visible within the combined complete image formed by the plurality of LED arrays.

The LED arrays of the first light emitting device display chip and the additional light emitting device display chips are each formed of an optically transparent substrate having a major surface with an array of light emitting devices formed on the major surface and cooperating together to generate a complete image, in combination a display, or combined complete image, composed of at least two colors.

Each of the light emitting devices have first and second electrodes for activating the light emitting devices. The optically transparent substrates of the varying wavelength LED arrays further have a plurality of external connection/mounting pads adjacent outer edges thereof and outside of the central portion of the major surface with the first electrodes of each of the LEDs being connected to a first plurality of the external connection/mounting pads and the second electrodes of the LEDs being connected to a second plurality of the external connection/mounting pads.

There is provided a mounting substrate having a major surface and defining a central portion substantially coextensive with the combined complete image generated by the plurality of light emitting device display chips. The mounting substrate further has a plurality of electrical conductors formed therein, each extending from a connection/mounting pad adjacent an edge of the central portion to a connection/mounting pad positioned on the major surface and about the periphery of the mounting substrate. The mounting substrate can be, for example, formed of glass or some other suitable material defining a central optically transparent light passage (window), a central portion, therethrough with the connection/mounting pads formed as a frame around the window. It is disclosed to incorporate an opaque portion between the mounting of the plurality of light emitting device display chips to aid in further defining the generated images. The major surface of the optically transparent substrates are mounted on the major surface of the mounting substrate with the first and second pluralities of external connection/mounting pads being in electrical contact with the connection/mounting pads of the mounting substrate.

A separate driver substrate can be provided having a plurality of driver and controller circuits mounted on the driver substrate and having data input terminals and control signal output terminals that when the driver substrate is properly registered on the mounting substrate, connects it to the first and second terminals of the light emitting devices for activating the light emitting devices to generate complete images in accordance with data signals applied to the data input terminals. Alternatively, it is disclosed to mount the plurality of driver and controller circuits directly on a surface of the mounting substrate.

In the preferred embodiment the plurality of external connection/mounting pads of the optically transparent substrates are bump bonded to the connection/mounting pads adjacent an edge of the central portion of the mounting substrate to substantially reduce the allowable pitch of the connection/mounting pads. Also, the connection/mounting pads on the major surface of the mounting substrate are positioned into a matrix of rows and columns to allow a substantially greater number of connection/mounting pads in a substantially smaller surface area. The driver substrate is bump bonded to the connection/mounting pads of the mounting substrate. A lens system is provided to magnify the complete images generated by the plurality of light emitting device display chips as a separate component or alternatively molded into the mounting substrate, substantially coextensive with the complete images projected by the plurality of light emitting device display chips.

BRIEF DESCRIPTION OF THE DRAWINGS

The novel features believed characteristic of the invention are set forth in the claims. The invention itself, however, as well as other features and advantages thereof will be best understood by reference to detailed descriptions which follow, when read in conjunction with the accompanying drawings, wherein:

FIG. 11 is an enlarged view of the components of FIG. 9, portions thereof broken away, assembled into a complete package;

FIG. 12 is an enlarged view of the components of FIG. 10, portions thereof broken away, assembled into a complete package;

FIG. 20 is a view in perspective of a portable communications receiver incorporating the integrated electro-optical package of the present invention;

FIG. 21 is a simplified view generally as seen from the line 21—21 of FIG. 20;

DESCRIPTION OF THE PREFERRED EMBODIMENT

Figure 1:
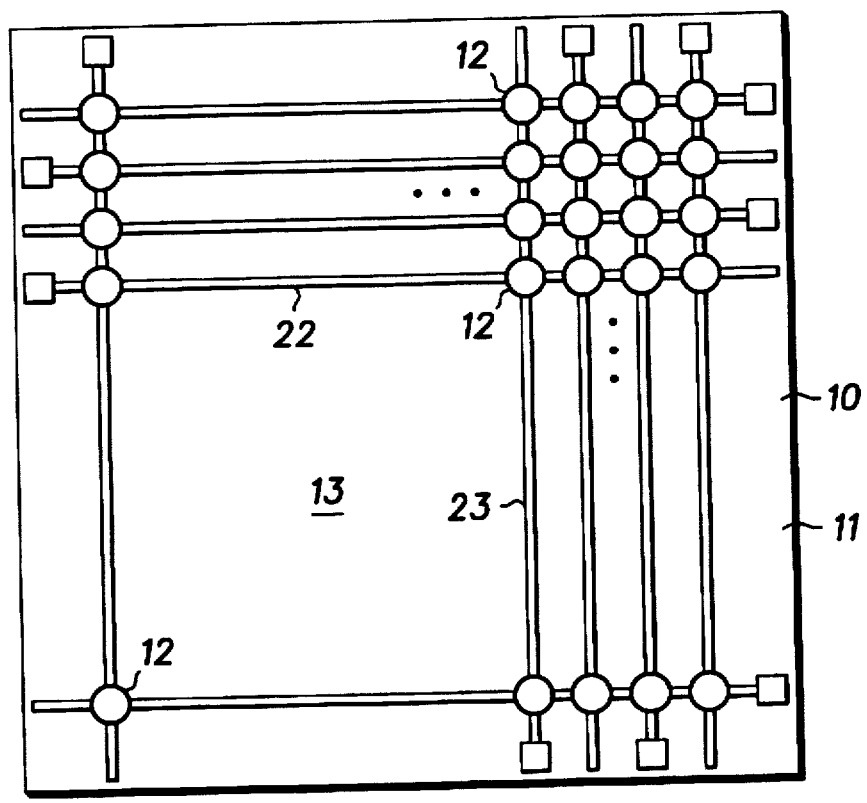
FIG. 1 is a greatly enlarged view in top plan of an array of light emitting devices on an optically transparent substrate, thereby forming an light emitting device display chip of the present invention.

During the course of this description, like numbers are used to identify like elements according to the different figures that illustrate the invention. It should be understood that a wide variety of light emitting devices, including liquid crystal displays (LCDs), light emitting diodes (LEDs), vertical cavity surface emitting lasers (VCSELs), etc., can be utilized in the present invention, but light emitting diodes will be utilized throughout the following description for simplicity. Referring specifically to FIG. 1, a greatly enlarged view in top plan of an optically transparent substrate 10 having an array 15 of light emitting devices thereon is illustrated. It is disclosed that the light emitting devices of the present invention include a plurality of electroluminescent elements. For simplicity of illustration, only a representative portion of optically transparent substrate 10 has been completed. Optically transparent substrate 10 has a major surface 11 with a plurality of light emitting devices 12 formed thereon. Light emitting devices 12 are organic/polymer electroluminescent elements or light emitting devices. Hereinafter, for simplification of this disclosure, the term organic/polymer will be shortened to "organic". In this embodiment, each of the light emitting device 12 defines a pixel, with light emitting devices 12 positioned in rows and columns and cooperating to generate a complete image, when activated, at a central portion 13 of major surface 11. The result is a single light emitting device imager (LEDI) chip, or light emitting device display chip, composed of the 2-D array 15 of visible light emitting devices 12, a plurality of horizontal interconnect conductors 22 and a plurality of vertical interconnect conductors 23 (discussed presently) and control circuitry (discussed presently), fabricated onto optically transparent substrate 10, e.g., an optically transparent glass substrate or a single gallium arsenide (GaAs) based semiconductor chip.

Figure 2:
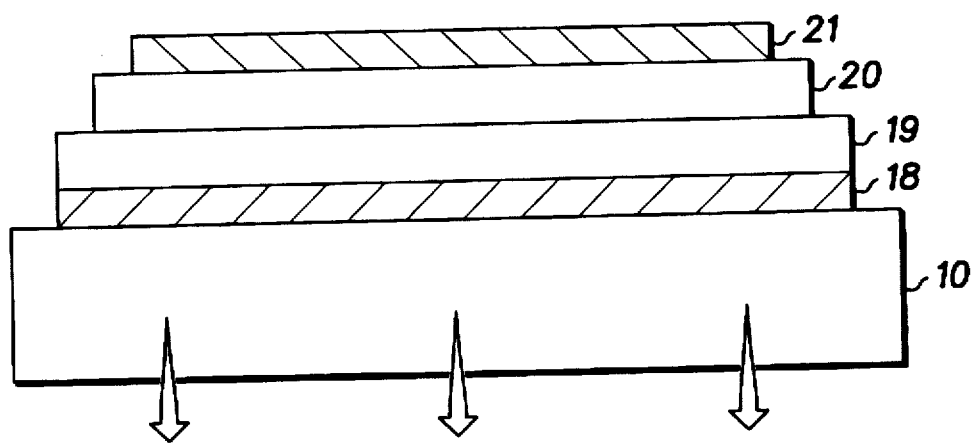
FIG. 2 is a simplified cross-sectional view of a single organic electroluminescent element on a glass substrate.

Referring specifically to FIG. 2, a simplified and greatly enlarged cross-sectional view one of the light emitting devices 12 on optically transparent substrate 10, which in this embodiment is an optically transparent glass substrate, is illustrated. Each of the light emitting devices 12 includes a layer 18 of conductive material which serves as the anode of each of the light emitting devices 12 in this specific embodiment. An organic layer or layers 19/20 includes one or more layers of polymers or low molecular weight organic compounds. The organic materials that form the layers are chosen for their combination of electrical and luminescent properties, and various combinations of hole transporting, electron transporting, and luminescent materials can be used. In this embodiment, for example, layer 19 is a hole transport layer and layer 20 is a luminescent electron transport layer. A second layer 21 of conductive material is deposited on the upper surface of layers 19/20 and serves as the cathode in this specific embodiment.

Generally, either the anode or the cathode must be optically transparent to allow the emission of light therethrough. In this embodiment layer 18 is formed of indium-tin oxide (ITO) which is optically transparent. In some applications a very thin metal film may be used as a transparent conductor instead of the ITO. Also, to reduce the potential required, the cathode is generally formed of a low work function metal/conductors or combination of metals/conductors, at least one of which has a low work function. In this embodiment the cathode is formed of low work function material, such as heavily doped diamond, or the cathode may be a conductive metal incorporating cesium, calcium or the like. The first electrodes, e.g. the anodes, of light emitting devices 12 are connected by horizontal interconnect conductors 22 to define rows of pixels, and the second electrodes, e.g. the cathodes, of light emitting devices 12 are connected by vertical interconnect conductors 23 to define columns of pixels as shown in FIG. 1, thereby forming addressable array 15 of light emitting devices 12.

A list of some possible examples of materials for the organic layer or layers 19/20 of the above described light emitting devices 12 follows. As a single layer of polymer, some examples are: poly(p-phenylenevinylene) (PPV); poly (p-phenylene) (PPP); and poly[2-methoxy,5-(2'-ethylhexoxy)1,4-phenylenevinylene] (MEH-PPV). As an electron transporting electroluminescent layer between a hole transporting layer or one of the single layer polymers listed above and a low work function metal cathode, an example is: 8-hydroxquinoline aluminum (ALQ). As an electron transporting material, an example is: 2-(4-tert-butylphenyl)-5-(p-biphenylyl)-1,3,4-oxadiazole (butyl-PBD). As a hole transport material, some examples are: 4,4'-bis[N-phenyl-N-(3-methylphenyl)amino]biphenyl (TPD); and 1,1-bis(4-di-p-tolyaminophenyl)cyclohexane. As an example of a fluorescent that may be used as a single layer or as a dopant to an organic charge transporting layer is coumarin 540, and a wide variety of fluorescent dyes. Examples of low work function metals include: Mg:In, Ca, and Mg:Ag.

Light emitting devices 12 are formed on optically transparent substrate 10 in a central portion 13 of major surface 11 less than approximately 20 microns in diameter, in the embodiment illustrated approximately 10 microns in diameter. Also, the pitch, or spacing between centers of light emitting devices 12, is less than approximately 30 microns, and in the preferred embodiment is 20 microns.

Figure 3:
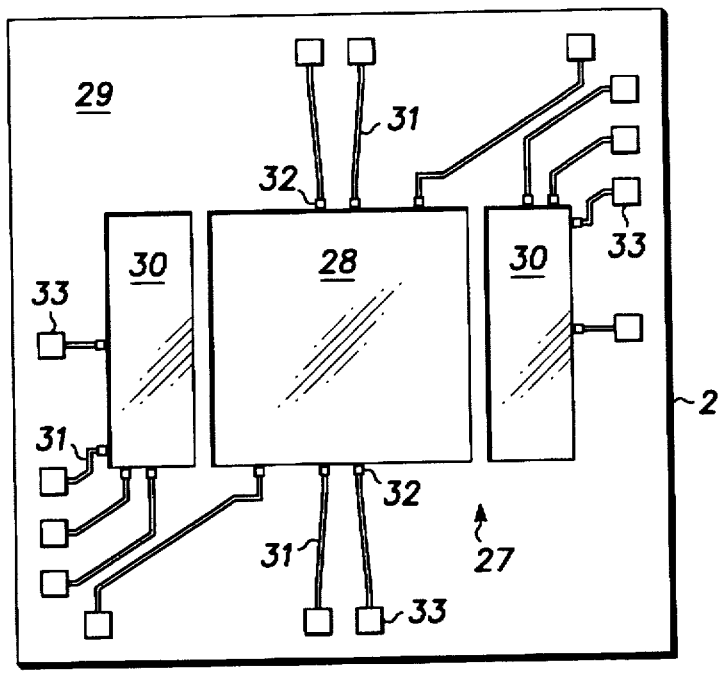
FIG. 3 is an enlarged view in top plan a mounting substrate including electrical connections having positioned and bump bonded thereon a plurality of light emitting device display chips.

In the preferred embodiment, there exist at least two light emitting device display chips within the electro-optical package of the present invention, thereby capable of generating a plurality of complete images that in combination provide for a multi-color display image, specifically, there exist at least two separate arrays 15 of light emitting devices 12, forming at least two separate and distinct light emitting device display chips, each of a different wavelength, thereby capable of generating a display composed of at least two different colors (to be discussed presently). For illustration purposes, FIG. 3 illustrates an enlarged view in top plan of a mounting substrate 25 defining a transparent central portion 27 of a major surface 29, having positioned and bump bonded thereon a plurality of light emitting device display chips. A first light emitting device display chip 28, composed of a first array 15 of light emitting devices 12 is constructed to emit at longer wavelengths, e.g. in a red/orange range, more specifically in a 645 nm range. Additional light emitting device display chips 30, composed of additional arrays 15 of light emitting devices 12, are constructed to emit at shorter wavelengths, e.g. in a blue/green range, more specifically in a 565 nm range. It is anticipated that light emitting device display chips 30 could alternatively be constructed to emit at a shorter wavelength, thereby emitting blue light in a range of wavelengths from 400 nm to 520 nm. It is also disclosed to utilize gallium nitride (GaN) and indium gallium nitride (InGaN), or gallium aluminum indium nitride (GaAlInN) and aluminum gallium nitride (AlGaN) in the formation of the LEDs of the present invention to achieve the blue, green, and/or red LEDs disclosed.

In the simplest embodiment, mounting substrate 25 is formed of a planar piece of optically transparent material, such as glass, so that at least transparent central portion 27 having the plurality of light emitting device display chips, referenced here as 28 and 30, mounted thereon is substantially coextensive with the image generated by light emitting device display chips 28 and 30. Transparent central portion 27 is substantially the same size as the area covered by light emitting device display chips 28 and 30 so that each of the complete image generated by light emitting devices 12 of light emitting device display chips 28 and 30 in cooperation is completely visible therethrough. As previously stated it is anticipated to provide for opaque separation between the mounting of the plurality of light emitting device display chips 28 and 30 to aid in further defining the generated images. A plurality of connection pads 32 are positioned about the transparent central portion 27 of mounting substrate 25 to cooperatively meet a plurality of first and second pluralities of external connection/mounting pads attached to alternate horizontal interconnect conductors 22 and alternate vertical interconnect conductors 23 of each array 15. A plurality of electrical conductors 31 connect the rows and columns of light emitting devices 12 to a similar plurality of connection pads 33 positioned on the major surface 11 and about the outer periphery of mounting substrate 25 so they are in electrical cooperation. To completely distribute electrical conductors 31 and connection pads 33 around the periphery of mounting substrate 25, electrical conductors 31 are attached through connection pads 32 to alternate horizontal interconnect conductors 22 and alternate vertical interconnect conductors 23. Thus, the space available between adjacent electrical conductors 31 is 2P, or in this specific embodiment approximately 20 microns.

By fanning out electrical conductors 31, connection pads 33 can be constructed large enough to provide easy electrical contact thereto. For example, if array 15 of light emitting devices 12 of light emitting device display chip 28 includes 40,000 devices (e.g., 200×200) and array 15 of light emitting devices 12 of each light emitting device display chip 30 includes 10,000 devices each (e.g., 50×200) and each device includes an area having a 10 micron diameter with a pitch P of 20 microns, then the area of the central portion 13 of optically transparent substrate 10 will be less than approximately 0.3 inches on a long side. Mounting substrate 25, in this specific embodiment, is constructed with a central portion 27 approximately 0.3 inches on a long side and an outer periphery of 0.5 inches on a side.

Figure 4:
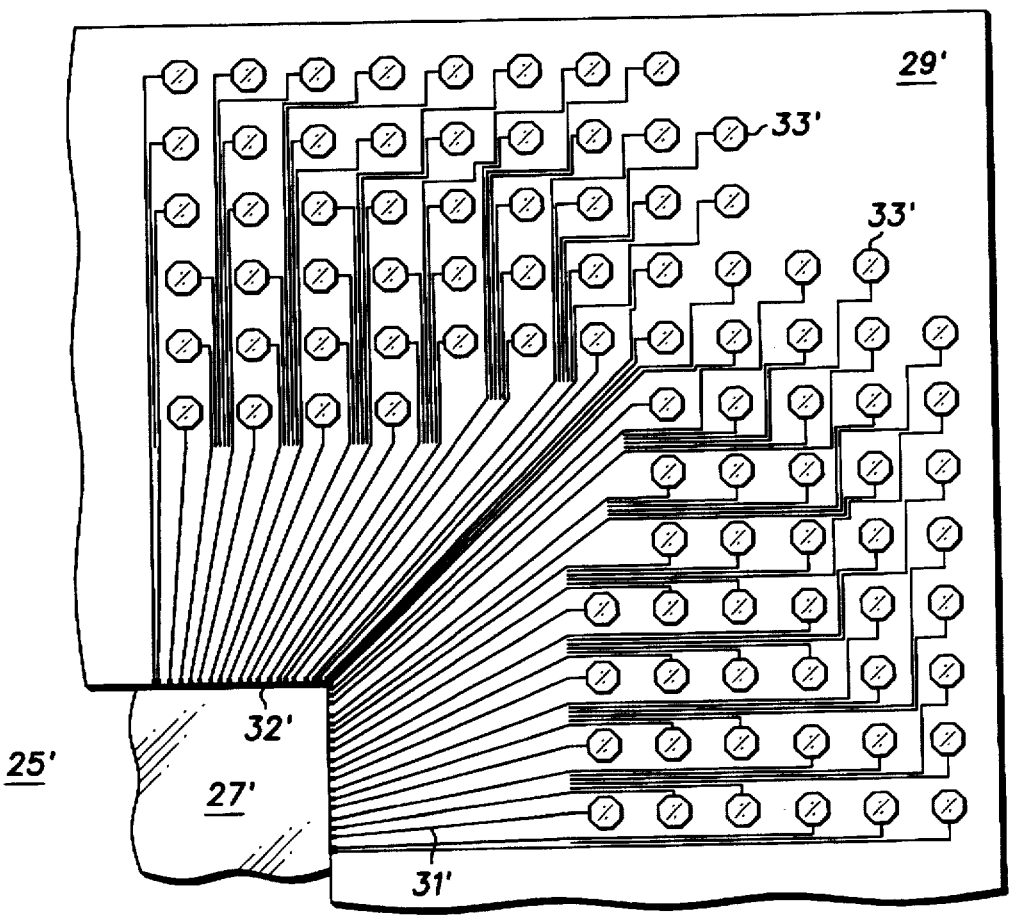
FIG. 4 is a greatly enlarged view in top plan of another embodiment of a mounting substrate, portions thereof broken away.

Referring specifically to FIG. 4, a greatly enlarged view in top plan of another embodiment of a mounting substrate, designated 25', having portions thereof broken away, is illustrated. It should be noted that all components similar to the components illustrated in FIGS. 1 and 3, are designated with similar numbers, having a prime added to indicate the different embodiment. At least an optically transparent central portion 27' is positioned to receive a plurality of light emitting device display chips thereon as described in conjunction with FIG. 3 and a plurality of electrical conductors 31' are positioned on a major surface 29' of mounting substrate 25' and are fanned out from a plurality of connection pads 32' positioned about the periphery of central portion 27' into contact with a plurality of connection pads 33'. Connection pads 33' are positioned in a matrix of rows and columns on major surface 29' surrounding central portion 27'. Generally, it is anticipated that connecting pads 33' can be positioned in the matrix with a pitch in the range of approximately 25 milli-inches to 50 milli-inches to allow sufficient space for electrical conductors 31' to extend therebetween as illustrated. For example, a matrix of connection pads 33' with a pitch of 40 milli-inches allows over 500 connection pads 33' on a one inch by one inch substrate with a central portion 27' of 0.2 inches by 0.4 inches.

In the instance in which mounting substrate 25 is formed of glass, standard thin film metallization can be utilized, at least for electrical conductors 31 and connection pads 32 and 33, in which layers of metal are deposited by, for example, sputtering. In a typical metallization system, a first layer of chromium is applied by sputtering to operate as an adhesive layer on the glass. A second layer of copper is applied over the chromium to provide the desired electrical conduction and a layer of gold is applied over the copper to provide a barrier and adhesive layer for further connections. It should be understood that the metallization can be either an additive or subtractive method with the patterning and etching being performed by any of the various methods well known in the art to provide the desired final structure.

In many applications the electrical conductor widths and pad sizes, as well as spacing, may be such that difficulty will be encountered in the fabrication, especially for the substrate. However, glass is an example of an optically transparent substrate material on which 10 to 15 micron wide electrical conductors with a pitch of 40 microns can be fabricated.

Figure 5:
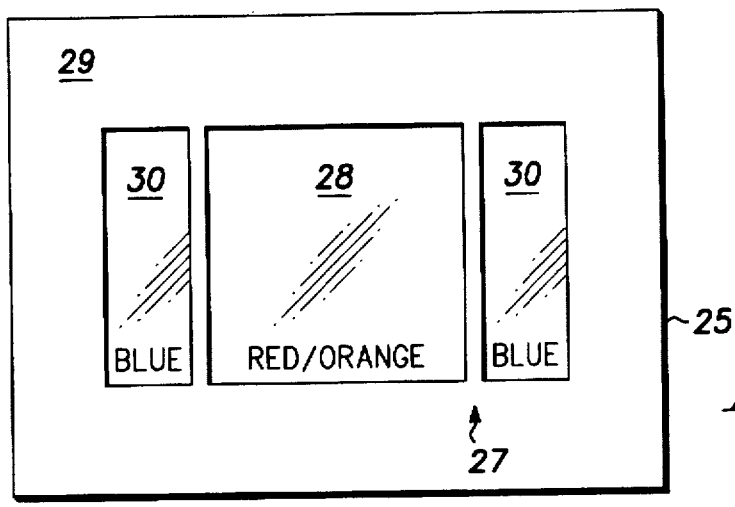
FIGS. 5–7 are simplified schematics of alternative configurations for the plurality of light emitting device display chips of the electro-optical package of the present invention.
Figure 6:
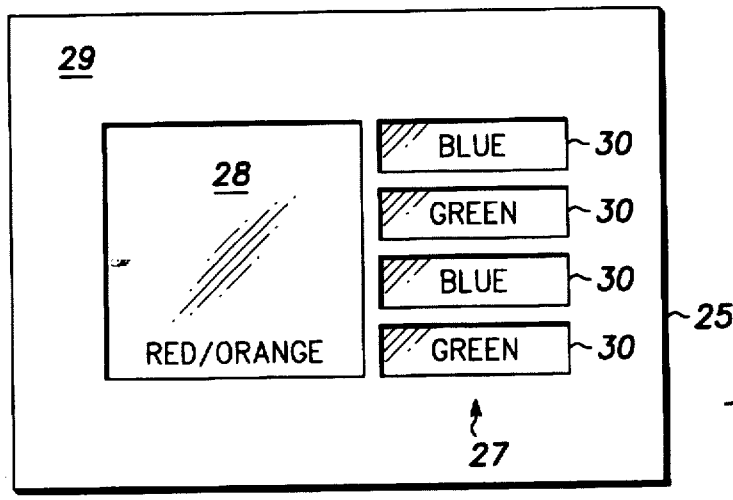
Figure 7:
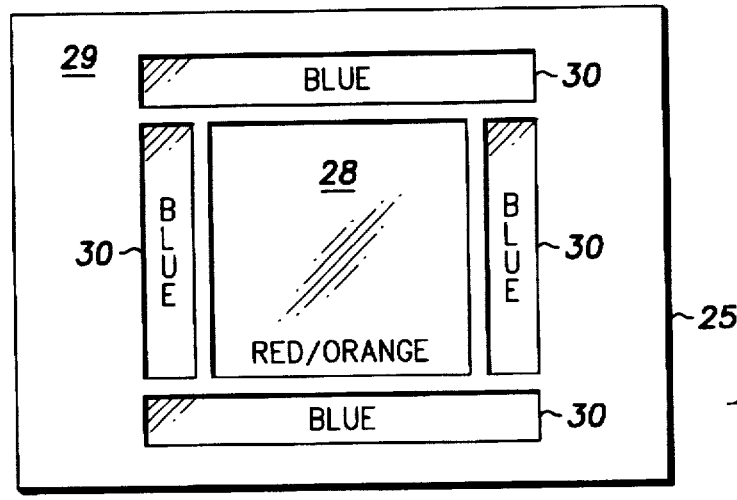

Referring now to FIGS. 5–7, schematically illustrated are alternative embodiments for the configuration of light emitting device display chips 28 and 30 of the electro-optical package of the present invention. As illustrated in FIGS. 5–7 there exist a plurality of configurations for the placement of light emitting device display chips 28 and 30 within the electro-optical package described herein. In general, there exist one basic light emitting device display chip, designated 28 herein, capable of emitting a high resolution display, or complete image, having additional light emitting device display chips 30, capable of emitting at a lower or different resolution than the basic light emitting device display chip 28, placed dependent upon the desired configuration of the combined image generated by light emitting device display chips 28 and 30. Specifically, if a menu or object bar is desired to be positioned on either side of the major high resolution display or complete image generated by light emitting device display chip 28, light emitting device display chips 30 are positioned on opposite sides as shown in FIG. 5. If it is desired to create an image, such as numerous menus or object bars of varying colors to one side of the major high resolution display, then light emitting device display chips 28 and 30 should be positioned within the electro-optical package of the present invention as shown in FIG. 6. To create an image, such as menus or objects bars which completely encircle the major high resolution display generated by light emitting device display chip 28, light emitting device display chips 30 should be configured as shown in FIG. 7. It should be understood that there exist infinite possibilities for configuring the light emitting device display chips 28 and 30 within the electro-optical package of the present invention dependent upon, size, location, color, resolution and quantity of the displayed images.

Figure 8:
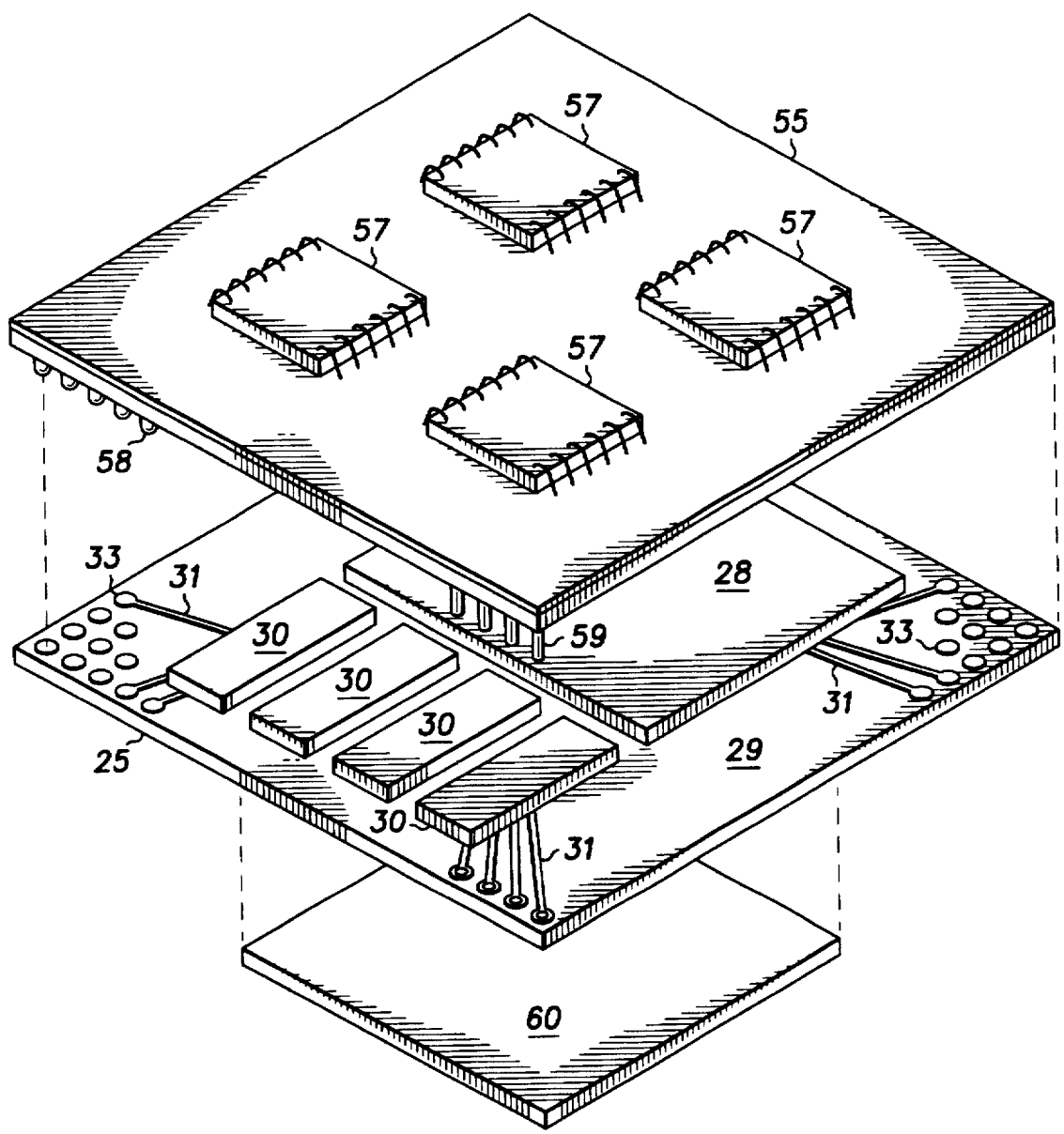
FIG. 8 is an exploded view in perspective illustrating the relative positions of the components of an electro-optical package in accordance with the present invention having an external lens system.
Figure 9:
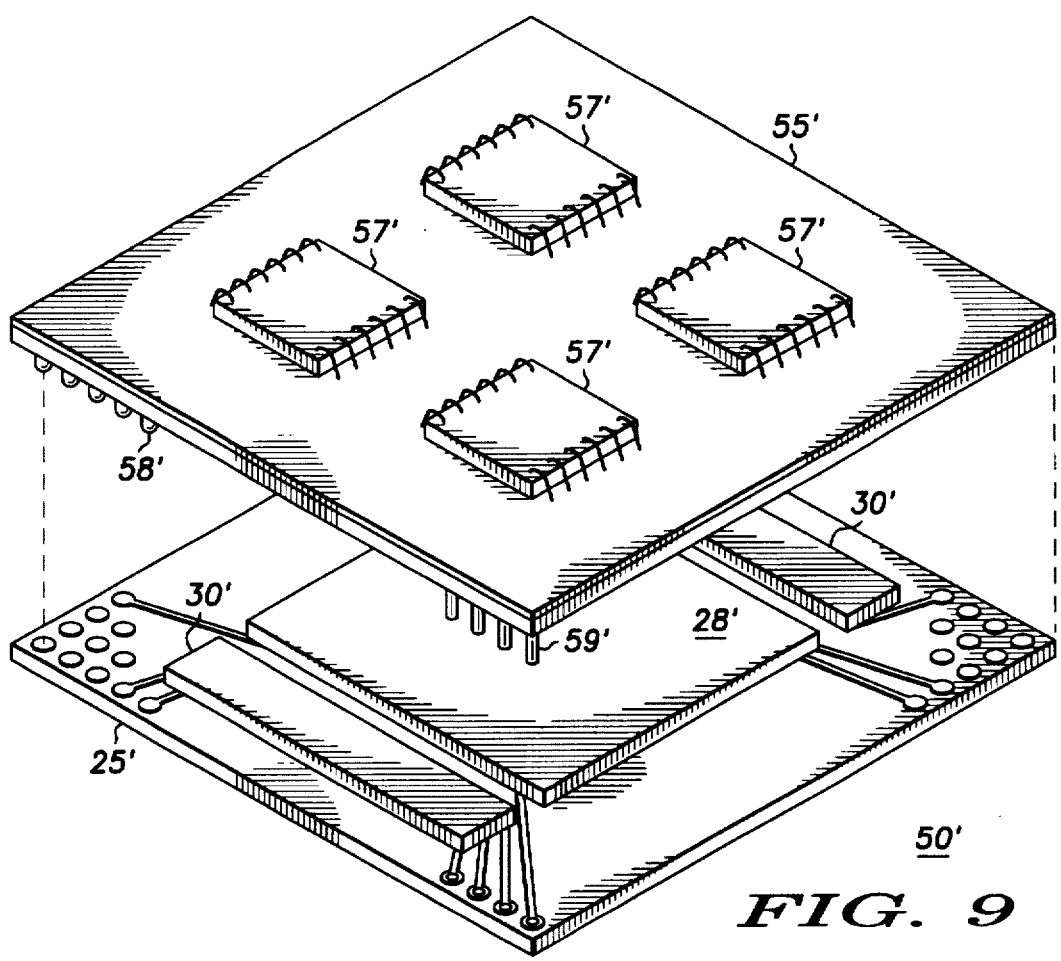
FIG. 9 is an exploded view in perspective illustrating the relative positions of the components of an electro-optical package in accordance with the present invention having the lens system molded in the mounting substrate.
Figure 10:
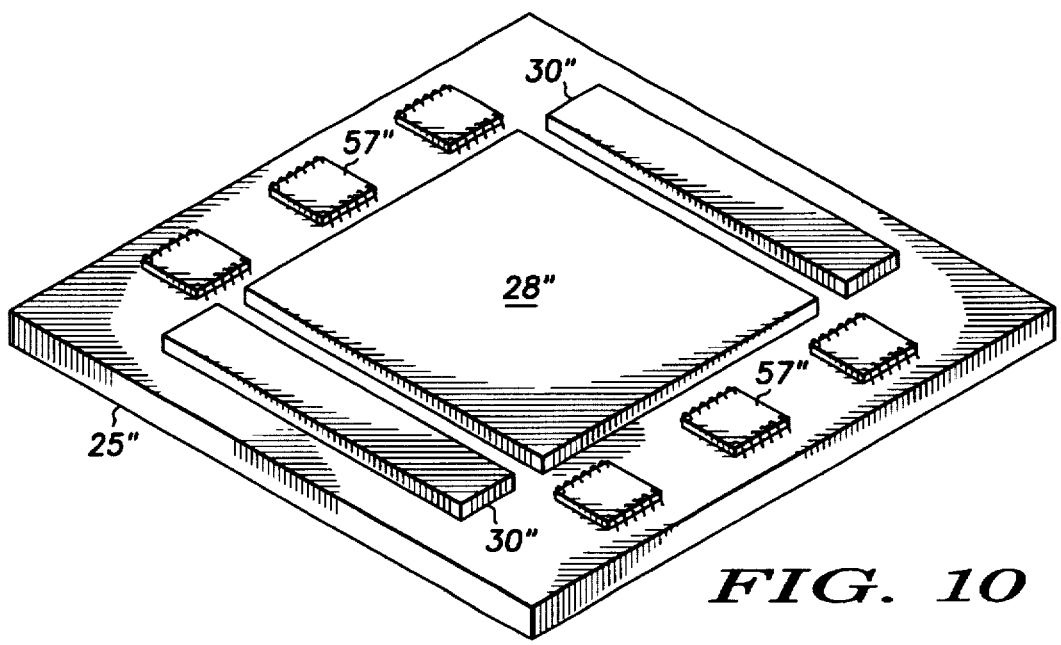
FIG. 10 is an exploded view in perspective illustrating the relative positions of the components of an electro-optical package in accordance with the present invention having a plurality of driver circuits mounted directly to the mounting substrate, having the lens system molded in the mounting substrate.

Exploded views in perspective illustrating the relative positions of the components of electro-optical packages 50, 50', and 50" are illustrated in FIGS. 8, 9 and 10. An enlarged view, portions thereof broken away, generally similar to the components of FIG. 9 assembled into a complete electro-optical package 50' is illustrated in FIG. 11. An enlarged view, portions thereof broken away, generally similar to the components of FIG. 10 assembled into a complete electro-optical package 50" is illustrated in FIG. 12. Again, it should be noted that all similar components of the disclosed embodiments are designated with similar numbers, having a prime or double prime added to indicate the different embodiments. Furthermore, with reference to FIGS. 8–12, description as to one component of one embodiment, applies to the same component of the alternative embodiments, i.e., description of mounting substrate 25 would also apply to mounting substrate 25' and 25", unless otherwise noted.

Referring specifically to FIGS. 8, 9 and 11, in addition to optically transparent substrate 10, and mounting substrate 25, a driver substrate, 55 is included having a first major surface and a second opposed major surface, a plurality of driver and control circuits 57 mounted on the first major surface thereof and defining a central area substantially coextensive with the complete images generated by first light emitting device display chip 28 and at least one additional light emitting device display chip 30. A plurality of driver and control circuits 57 generally are formed as smaller integrated circuits which are wire bonded or bump bonded to electrical contacts on the first major surface of driver substrate 55, having glob top formations formed thereon to protect driver and control circuits 57. Driver substrate 55 is, for example, a convenient printed circuit board, such as FR4 or the like, and has either bumps 58 of contact material, such as C5 solder, solderable plated metal, or the like, or connecting pins 59 positioned on the second opposed major surface thereof. Because the pitch of connection pads 33 on mounting substrate 25 is (or can be) relatively large, relatively large bumps 58 or pins 59 can be utilized at this point.

Bumps 58 are formed of a material that is a relatively good electrical conductor and which can be at least partially melted and reset to form a good physical connection. Material which can be utilized for this purpose includes gold, copper, solder and especially high temperature solder, conducting epoxy, etc. A bump height of up to 80 microns can be formed on a square or round connection/mounting pad with a 20 micron diameter. For smaller pitches, 5 micron diameter copper bumps with a pitch of 10 microns have been formed with a bump height of 20 microns. Also, 15 micron diameter gold bumps on a 30 micron pitch have been formed to a height of 30 to 45 microns. Some compatible metal may improve the assembly procedures, e.g., gold metallization or gold plating on connection pads 33 of optically transparent substrate 10.

In the assembly process, mounting substrate 25 is positioned so that major surface 29 is up and connection pads 33 are positioned to each contact a separate bump 58 or connecting pin 59 on driver substrate 55 when mounting substrate 25 is properly registered, as illustrated in FIGS. 8 and 9. In one fabrication technique, mounting substrate 25 includes gold connection pads 33 and is thermo-compression bonded to driver substrate 55.

Referring specifically to FIGS. 10 and 12, illustrated is electro-optical package 50", having driver and control circuits 57" directly mounted to mounting substrate 25", without the need for the inclusion of a driver substrate (generally similar to driver substrate 55) within electro-optical package 50". In this specific embodiment, driver and control circuits 57" are wire or bump bonded to electrical connections (not shown) positioned on major surface 29" of mounting substrate 25". Alternatively, it is disclosed to mount driver and control circuits 57" on a surface of mounting substrate 25" opposite the mounting of light emitting device display chips 28" and 30". In the instance where driver and control circuits 57" are positioned on a side of mounting substrate 25" opposite the mounting of light emitting device display chips 28" and 30", embedded leadframes and/or plated through-hole vias (not shown) are utilized to electrically interface light emitting device display chips 28" and 30" with driver and control circuits 57". It is further disclosed where driver and control circuits 57" are mounted directly to mounting substrate 25", to protect driver and control circuits 57" and light emitting device display chips 28" and 30" with standard glob-top formations well known in the art.

At the point illustrated in FIGS. 8–10 where mounting substrate 25 is substantially completed, mounting substrate 25 can be easily tested and/or burned in prior to additional assembly of the package. This ability to provide an intermediate test point can be a substantial cost and time saving in the packaging procedure.

The final additional component in electro-optical packages 50, 50' and 50" is a lens 60 which is fabricated to overlie central portion 13 in mounting substrate 25 opposite the mounting of light emitting device display chips 28 and 30 as shown in FIG. 8. In an alternative embodiment, and as illustrated in FIGS. 9 and 10, lens 60 is integrally molded into mounting substrate 25, in central portion 27, at the time of formation by either transfer molding or injection molding techniques, substantially coextensive with the combined complete image generated by light emitting device display chips 28 and 30. Lens 60 is designed to magnify the complete image generated by the at least two arrays 15 of light emitting devices 12 of light emitting device display chips 28 and 30, formed on optically transparent substrate 10. As shown in FIG. 8, lens 60 is affixed to the underside of mounting substrate 25 by some convenient optically transparent epoxy, snap-fit protrusions and cooperating voids, or the like and is fabricated so as to simply overlie central portion 27 of mounting substrate 25.

The interstice between driver substrate 55 and mounting substrate 25 mounted thereon is filled with an optically transparent material 63 (as shown in FIG. 10), which may be any convenient material to provide support and make electro-optical packages 50 and 50' a more robust package. Depending upon the material utilized in the formation of light emitting device display chips 28 and 30, a cavity 64 (as shown in FIG. 11) may be formed in driver substrate 55 to receive chips 28 and 30 and the edges of chips 28 and 30 can be positioned sufficiently close to driver substrate 55 to act like an encapsulant dam so that the interstice between the upper surface of chips 28 and 30 and driver substrate 55 is left open or unfilled. Thus, light emitting device display chips 28 and 30 and driver substrate 55 are not physically attached together and different coefficients of expansion will have little or no effect.

It should be understood that for best results mounting substrate 25, optically transparent material 63 and lens 60 should be constructed with indices of refraction which are as close together as practical. If, for example, the index of refraction of mounting substrate 25, optically transparent material 63 and lens 60 differs substantially there is a tendency for light to reflect at the interface back into light emitting device display chips 28 and 30 and the efficiency of electro-optical package 50 is reduced. Generally, an index of refraction of approximately 1.5 for mounting substrate 25, optically transparent material 63 and lens 60 has been found to be acceptable.

Figure 14:
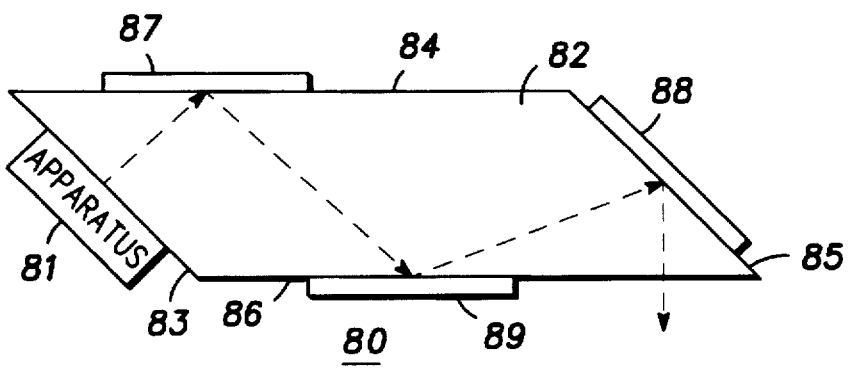
FIGS. 14 and 15 are additional simplified schematic views, similar to FIG. 13, of other miniature virtual image displays incorporating the integrated electro-optical package of the present invention.
Figure 15:
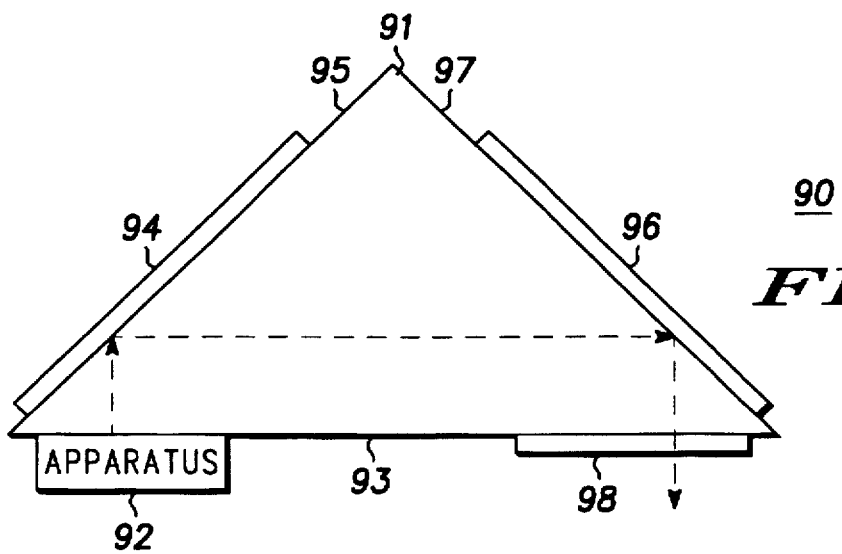

It should be understood that the complete image generated by the arrays of light emitting devices 12 of light emitting device display chips 28 and 30 on mounting substrate 25 is too small to properly perceive (fully understand) with the human eye and generally requires a magnification of at least 10× for comfortable and complete viewing. Lens 60 can be a single lens with additional optical magnification supplied by an external system or lens 60 can include a complete magnification system. Further, lens 60 can be fabricated from glass, plastic or any other material or method well known to those skilled in the optical art. Also, in some applications lens 60 may be a complete external magnification system and may not be physically attached as a portion of electro-optical package 50, or molded into mounting substrate 25. Several examples of an optical magnification system, or lens system, that may be incorporated into lens 60 or applied externally thereto are illustrated in FIGS. 13 through 15, explained below.

Figure 13:
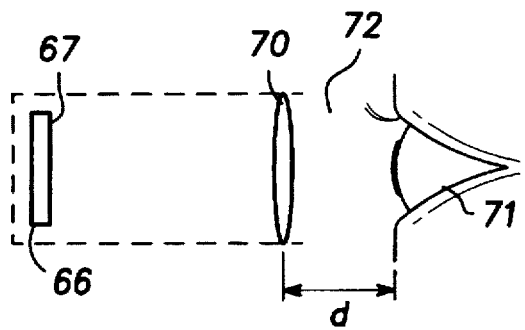
FIG. 13 is a simplified schematic view of a miniature virtual image display incorporating the integrated electro-optical package of the present invention.

Referring to FIG. 13, a miniature virtual image display 65 is illustrated in a simplified schematic view. Miniature virtual image display 65 includes image generation apparatus 66, similar to electro-optical packages 50, 50' and 50" described above, for providing an image on a surface 67. An optical system, represented by lens 70, is positioned in spaced relation to surface 67 of miniature virtual image display 65 and produces a virtual image viewable by an eye 71 spaced from an aperture 72 defined by lens system 70.

As technology reduces the size of the electro-optical package and/or the light generating devices contained within, greater magnification and smaller lens systems are required.

An optical magnification system, or lens system 70, represented schematically by a single lens, is mounted in spaced relation from surface 67 so as to receive the image from surface 67 and magnify it an additional predetermined amount. It will of course be understood that lens system 70 may be adjustable for focus and additional magnification, if desired, or may be fixed in a housing for simplicity. Because the image received by lens system 70 from surface 67 is much larger than the image generated by image generation apparatus 66, lens system 70 does not provide the entire magnification and, therefore, is constructed larger and with less magnification. Because of this larger size, the lens system has a larger field of view and a greater working distance.

Eye relief is the distance that eye 71 can be positioned from viewing aperture 72 and still properly view the image, which distance is denoted by "d" in FIG. 11. Because of the size of lens system 70, eye relief, or the distance d, is sufficient to provide comfortable viewing and in the present embodiment is great enough to allow a viewer to wear normal eyeglasses, if desired. Because of the improved eye relief the operator can wear normal corrective lenses (personal eyeglasses), and the complexity of focusing and other adjustable features can be reduced, therefore, simplifying the construction of miniature virtual image display 65.

Referring to FIG. 14, another miniature virtual image display is illustrated in a simplified schematic. In waveguide virtual image display 80, image generation apparatus 81, similar to electro-optical packages 50, 50' and 50" described above, is affixed to the inlet of an optical waveguide 82 for providing a complete image thereto. Optical waveguide 82 is formed generally in the shape of a parallelogram (side view) with opposite sides, 83, 84 and 85, 86, equal and parallel but not perpendicular to adjacent sides. Side 83 defines the inlet and directs light rays from the complete image at image generation apparatus 81 onto a predetermined area on adjacent side 86 generally along an optical path defined by all four sides. Three diffractive lenses 87, 88 and 89 are positioned along adjacent sides 84, 85 and 86, respectively, at three predetermined areas and the magnified virtual image is viewable at an outlet in side 86. This particular embodiment illustrates a display in which the overall size is reduced somewhat and the amount of material in the waveguide is reduced to minimize weight and material utilized.

Referring to FIG. 15, another specific miniature virtual image display is illustrated in a simplified schematic. In waveguide virtual image display 90 an optical waveguide 91 having a generally triangular shape in side elevation is utilized. Image generation apparatus 92, similar to electro-optical packages 50, 50' and 50" described above, for producing a complete image, is affixed to a first side 93 of optical waveguide 91 and emanates light rays which travel along an optical path directly to a diffractive lens 94 affixed to a second side 95. Light rays are reflected from diffractive lens 94 to a diffractive lens 96 mounted on a third side 97. Lens 96 in turn reflects the light rays through a final diffractive lens 98 affixed to the outlet of optical waveguide 91 in side 93, which diffractive lens 98 defines a viewing aperture for waveguide virtual image display 90. In this particular embodiment the sides of waveguide virtual image display 90 are angularly positioned relative to each other so that light rays enter and leave the inlet and outlet, respectively, perpendicular thereto.

Figure 16:
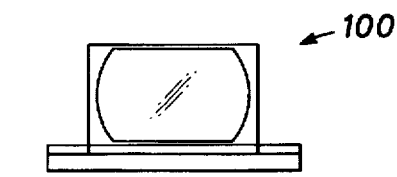
FIGS. 16, 17 and 18 illustrate a front view, side elevational view, and a top plan, respectively, of an image manifestation apparatus utilizing the integrated electro-optical package of the present invention.
Figure 17:
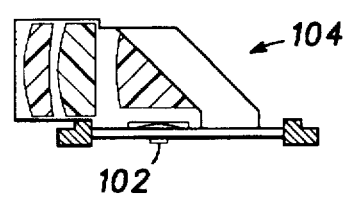
Figure 18:
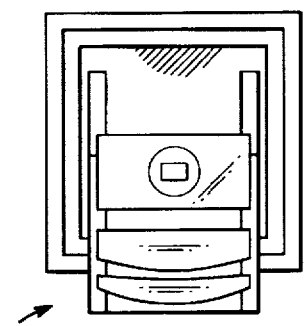

Referring now to FIGS. 16, 17 and 18, another miniature virtual image display 100 in accordance with the present invention, is illustrated in a front view, side elevational view, and top plan, respectively. FIGS. 16, 17 and 18 illustrate miniature virtual image display 100 approximately the actual size to provide an indication as to the extent of the reduction in size achieved by the present invention. Miniature virtual image display 100 includes an integrated electro-optical package 102 generally similar to electro-optical packages 50, 50' and 50" of the present invention. In a preferred embodiment, integrated electro-optical package 102 produces a luminance less than approximately 15 fL. This very low luminance is possible because miniature virtual image display 100 produces a virtual image. Integrated electro-optical package 102 is mounted onto lens system 104, which magnifies the image approximately 20× to produce a virtual image approximately the size of an 8.5"×11" sheet of paper.

Here is should be noted that because integrated electro-optical package 102 is very small and the fact that a virtual image is utilized, rather than a direct view display, the overall physical dimensions of miniature virtual image display 100 are approximately 1.5 inches (3.8 cm) wide by 0.75 inches (1.8 cm) high by 1.75 inches (4.6 cm) deep, or a total volume of approximately 2 cubic inches (32 cm$^3$).

Figure 19:
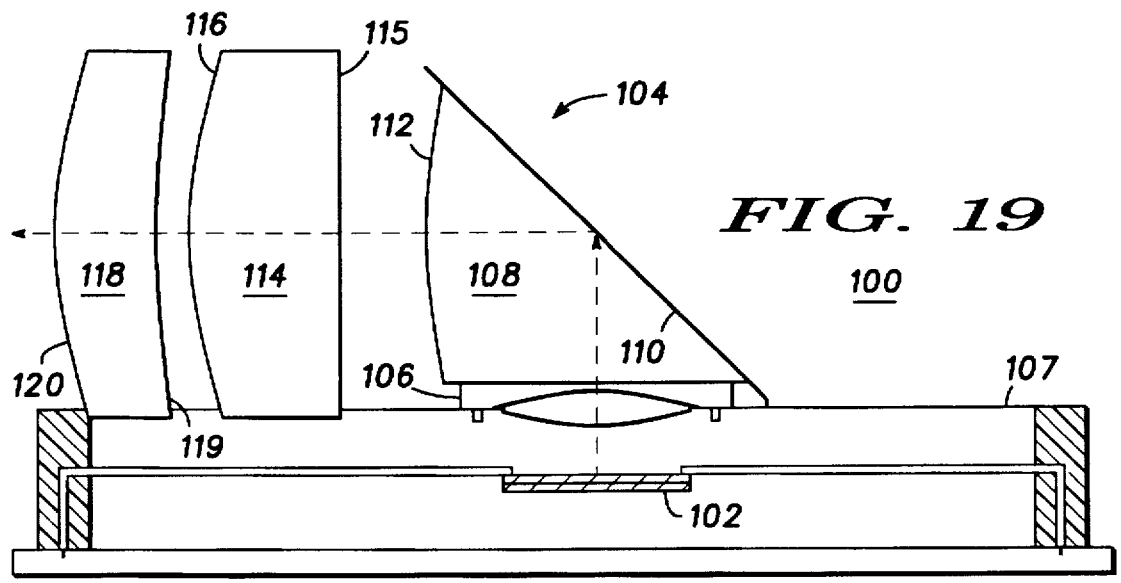
FIG. 19 is a 4× magnified view in side elevation of the apparatus of FIG. 16.

Referring specifically to FIG. 19, a 4× magnified view in side elevation of miniature virtual image display 100 of FIG. 14 is illustrated for clarity. From this view it can be seen that a first optical lens 106 is affixed directly to the upper surface of mounting substrate 107 (generally similar to mounting substrate 25). An optical prism 108 is mounted to reflect the image from a surface 110 and from there through a refractive surface 112. The image is then directed to an optical lens 114 having a refractive inlet surface 115 and a refractive outlet surface 116. From optical lens 114 the image is directed to an optical lens 118 having an inlet refractive surface 119 and an outlet refractive surface 120. Also, in this embodiment at least one diffractive optical element is provided on one of the surfaces, e.g. surface 110 and/or refractive inlet surface 115, to correct for aberration and the like. The operator looks into outlet refractive surface 120 of lens 118 and sees a large, easily discernible virtual image which appears to be behind miniature virtual image display 100.

FIG. 20, illustrates a portable electronic device, having a data output terminal (not shown), namely a portable communications receiver 130 having a hand held microphone 131 with a miniature virtual image display 132 mounted therein It will of course be understood that portable communications receiver 130 can be any of the well known portable communications equipment, such as a cellular or cordless telephone, a two-way radio, a pager, a data bank, etc. In the present embodiment, for purposes of explanation only, portable communications receiver 130 is a portable two-way police radio, generally the type carried by police officers on duty or security guards. Portable communications receiver 130 includes a control panel 134 for initiating calls and a standard visual display 136, if desired, for indicating the number called or the number calling. Alternately, 136 includes a speaker in addition to or instead of the visual display. Hand held microphone 131 has a push-to-talk switch 138 and a voice pick-up 140.

Referring to FIG. 21, a simplified sectional view of hand held microphone 131, as seen from the line 21—21, is illustrated. Miniature virtual image display 132 includes an electro-optical package similar to electro-optical packages 50, 50' and 50", described above, having image generation apparatus 141 for providing a complete image to a fixed optical system 142, which in turn produces a virtual image viewable by the operator through an aperture 144. Fixed optical system 142 is constructed to magnify the entire complete image from image generation apparatus 141, without utilizing moving parts, so that the virtual image viewable through aperture 144 is a complete frame, or picture, which appears to be very large (generally the size of a printed page) and is easily discernible by the operator. The entire electro-optical package is relatively small and adds virtually no additional space requirements to hand held microphone 131. Optical system 142 is constructed with no moving parts, other than optional features such as focusing, zoom lenses, etc. Further, hand held microphone 131 requires very little electrical power to generate the complete image and, therefore, adds very little to the power requirements of portable communications receiver 130.

Figure 22:
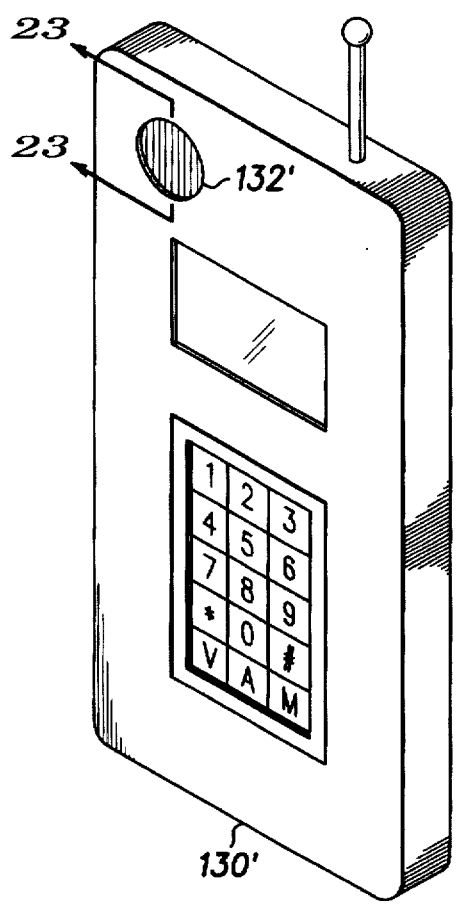
FIG. 22 is a view in perspective of another portable communications receiver incorporating the integrated electro-optical package of the present invention.
Figure 23:
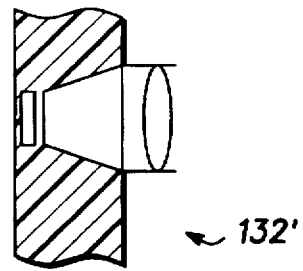
FIG. 23 is a simplified view generally as seen from the line 23—23 of FIG. 22.

Referring specifically to FIGS. 22 and 23, a second embodiment is illustrated wherein parts similar to those described in relation to FIGS. 20 and 21 are designated with similar numbers with a prime added to the numbers to indicate a different embodiment. In this embodiment a portable communications receiver 130' has a miniature virtual image display 132' included in the body thereof, instead of in a hand held microphone. A hand held microphone is optional and this specific embodiment is desirable for instances where a hand held microphone is not utilized or not available or for use in pagers and the like which do not transmit. Miniature virtual image display 132' is basically similar to miniature virtual image display 132 of FIGS. 20 and 21 and adds very little to the size, weight, or power consumption of communications receiver 130'.

Figure 24:
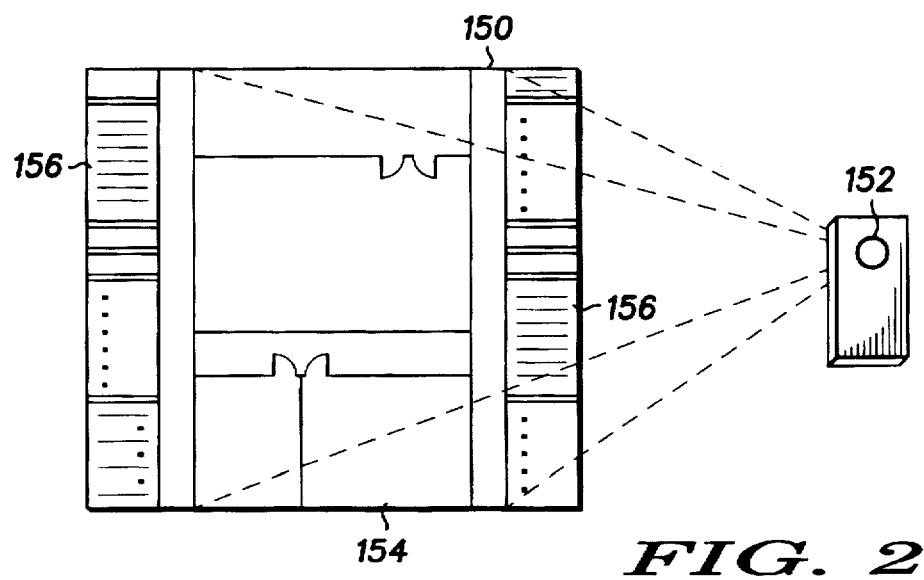
FIG. 24 is a view in perspective illustrating a typical view as seen by the operator of the portable communications receiver of FIG. 20.

FIG. 24 is a perspective view of hand held microphone 131 illustrating a typical view 150 seen by an operator looking into viewing aperture 152 of miniature virtual image display 132, described in conjunction with FIGS. 20 and 21. View 150 could be, for example, a floor plan of a building about to be entered by the operator (a policeman). In operation, the floor plan is on file at the police station and, when assistance is requested by the policeman, the station simply transmits video representative of the previously recorded plan. Similarly, miniature virtual image display 132 might be utilized to transmit pictures of missing persons or wanted criminals, maps, extremely long messages, etc. View 150 includes a main high resolution display 154 generated by a main light emitting device display chip (generally similar to light emitting device display chip 28) and a plurality of lower resolution color menus or object bars 156 generated by additional light emitting device display chips (generally similar to light emitting device display chip 30) constructed to emit light in a different range than the main light emitting device display chip. Accordingly, in that object bars 156 are generated by separate light emitting device display chips than main high resolution display 154, view 150 is displayed in contrasting multi-colors.

Thus, the present invention illustrates and teaches integrated electro-optical packages which are capable of generating multi-color image displays utilizing a plurality of light emitting device display chips, that are not limited in size by the electrical connections and which are substantially smaller than previous integrated packages. Also, the present invention illustrates and teaches integrated electro-optical packages which contain arrays of light generating devices with substantially greater numbers of devices than previous integrated packages. Further, the need for interconnect and packaging structures and techniques which can substantially reduce the limitation on size of semiconductor chips and which can reduce the amount of required surface area is substantially reduced, or eliminated, by the present invention.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. An integrated electro-optical package comprising:

a first light emitting device display chip comprised of an optically transparent substrate with an array of light emitting devices formed on a major surface and cooperating to generate a complete image, the light emitting devices being positioned in rows and columns to define all pixels of the complete image and operably connected to a plurality of connection pads adjacent outer edges of the optically transparent substrate;

at least one additional light emitting device display chip comprised of an optically transparent substrate with an array of light emitting devices formed thereon, constructed to emit light of a different wavelength than the light emitting devices of the first light emitting device display chip, cooperating to generate a complete image, the light emitting devices being positioned in rows and columns to define all pixels of the complete image and operably connected to a plurality of connection pads adjacent outer edges of the optically transparent substrate;

a mounting substrate defining an optically transparent central portion, substantially coextensive with the complete image generated by the first light emitting device display chip and the complete image generated by the at least one additional light emitting device display chip, having a plurality of connection pads formed on a surface surrounding the optically transparent central portion and a plurality of connection pads formed on a surface about a periphery of the mounting substrate in electrical cooperation with the plurality of connection pads surrounding the optically transparent central portion, the plurality of connection pads of the first light emitting device display chip and the at least one additional light emitting device display chip being bump bonded to the plurality of connection pads surrounding the optically transparent central portion on the mounting substrate; and a plurality of driver circuits connected to the first light emitting device display chip and the at least one additional light emitting device display chip through the connection pads on the mounting substrate, and the plurality of connection pads on the optically transparent substrate of the first light emitting device display chip and the at least one additional light emitting device display chip.

2. An integrated electro-optical package as claimed in claim 1 wherein the optically transparent substrate is formed of optically transparent glass.

3. An integrated electro-optical package as claimed in claim 1 wherein the light emitting devices of the first light emitting device display chip are constructed to emit light in a red/orange range and the light emitting devices of the at least one additional light emitting device display chip are constructed to emit light in a blue/green range.

4. An integrated electro-optical package as claimed in claim 1 wherein the array of light emitting devices of the first light emitting device display chip and of the at least one additional light emitting device display chip includes a plurality of organic electroluminescent elements.

5. An integrated electro-optical package as claimed in claim 4 wherein the plurality of organic electroluminescent elements of the first light emitting device display chip and the at least one additional light emitting device display chip each include a first conductive layer positioned on the major surface of the optically transparent substrate, at least one layer of organic material positioned on the first conductive layer, and a second conductive layer positioned on the at least one layer of organic material.

6. An integrated electro-optical package as claimed in claim 5 wherein the at least one layer of organic material on the first conductive layer includes one of a layer of polymer and a layer of low molecular weight organic compound.

7. An integrated electro-optical package as claimed in claim 1 further comprising a driver substrate defining a central area substantially coextensive with the complete image generated by the first light emitting device display chip and the complete image generated by the at least one additional light emitting device display chip, having a plurality of connection pads formed about a periphery of the driver substrate, the plurality of connection pads formed on a surface about a periphery of the mounting substrate being bump bonded to the plurality of connection pads on the driver substrate, and a lens system positioned substantially coextensive with the complete image generated by the first light emitting device display chip and the complete image generated by the at least one additional light emitting device display chip, to receive and magnify the complete images and produce an easily viewable virtual image.

8. An integrated electro-optical package as claimed in claim 7 wherein the lens system positioned substantially coextensive with the complete image generated by the first light emitting device display chip and the complete image generated by the at least one additional light emitting device display chip is molded into the optically transparent central portion of the mounting substrate.

9. An integrated electro-optical package as claimed in claim 7 wherein the lens system positioned substantially coextensive with the complete image generated by the first light emitting device display chip and the complete image generated by the at least one additional light emitting device display chip is mounted to the mounting substrate on a side of the mounting substrate opposite a mounting of the first light emitting device display chip and the at least one additional light emitting device display chip.

10. An integrated electro-optical package comprising:

a first light emitting device display chip comprised of an optically transparent substrate having a major surface with an array of light emitting devices formed on the major surface at a central portion thereof, constructed to emit at a wavelength in a specific range and cooperating to generate a complete image, each of the light emitting devices having a first electrode and a second electrode for activating the light emitting devices, the light emitting device display chip further having a plurality of external connection pads adjacent outer edges thereof and outside of the central portion of the major surface with each of the first electrodes of the light emitting devices being connected to a first plurality of the external connection pads and each of the second electrodes of the light emitting devices being connected to a second plurality of the external connection pads;

at least one additional light emitting device display chip comprised of an optically transparent substrate having a major surface with an array of light emitting devices formed on the major surface at a central portion thereof, constructed to emit light of a shorter wavelength than the light emitting devices of the first light emitting device display chip, in a specific range, and cooperating to generate a complete image, each of the light emitting devices having first and second electrodes for activating the light emitting devices, the light emitting device display chip further having external connection pads adjacent outer edges thereof and outside of the central portion of the major surface with the first electrodes of the light emitting devices being connected to a first plurality of the external connection pads and the second electrodes of the light emitting devices being connected to a second plurality of the external connection pads;

a mounting substrate defining an optically transparent central portion, substantially coextensive with the complete image generated by the first light emitting device display chip and the complete image generated by the at least one additional light emitting device display chip, having a plurality of connection pads formed on a surface surrounding a central portion and a plurality of connection pads formed on a surface about a periphery of the mounting substrate in electrical cooperation with the plurality of connection pads formed on the surface surrounding the central portion, the plurality of connection pads of the first light emitting device display chip and the at least one additional light emitting device display chip being bump bonded to the plurality of connection pads formed on the surface surrounding the central portion on the mounting substrate;

a driver substrate having a first major surface and a second opposed major surface and defining a central area in the first major surface substantially coextensive with the first light emitting device display chip and the at least one additional light emitting device display chip, the driver substrate further having a plurality of electrical conductors formed therein, and a plurality of connection pads adjacent an edge of the central area on the first major surface and a plurality of connection pads on the second opposed major surface of the driver substrate, each of the plurality of electrical conductors extending from a connection pad adjacent an edge of the central area on the first major surface to a connection pad on the second opposed major surface of the driver substrate, the mounting substrate being mounted on the first major surface of the driver substrate with the plurality of connection pads formed on a surface about the periphery of the mounting substrate being in electrical contact with the plurality of connection pads on the first major surface of the driver substrate; and a plurality of driver and controller circuits mounted on the second opposed major surface of the driver substrate and having data input terminals and further having control signal output terminals connected to the first light emitting device display chip and the at least one additional light emitting device display chip through the plurality of connection pads on the first and second opposed major surfaces of the driver substrate, the plurality of electrical conductors, and the plurality of connection pads on the first major surface of the mounting substrate and the plurality of external connection pads on the optically transparent substrate for activating the light emitting devices of the first light emitting device display chip and the at least one additional light emitting device display chip to generate a plurality of complete images in accordance with data signals applied to the data input terminals.

11. An integrated electro-optical package as claimed in claim 10 wherein the light emitting devices of the first light emitting device display chip are constructed to emit at wavelengths in a range of 550 to 750 nm and the light emitting devices of the at least one additional light emitting device display chip are constructed to emit at wavelengths in a range of 400 to 750 nm.

12. An integrated electro-optical package as claimed in claim 10 wherein the array of light emitting devices of the first light emitting device display chip and the array of light emitting devices of the at least one additional light emitting device display chip includes a plurality of organic electroluminescent elements.

13. An integrated electro-optical package as claimed in claim 12 wherein the plurality of organic electroluminescent elements of the first light emitting device display chip and the at least one additional light emitting device display chip each include a first conductive layer positioned on the major surface of the optically transparent substrate, at least one layer of organic material positioned on the first conductive layer, and a second conductive layer positioned on the at least one layer of organic material.

14. An integrated electro-optical package as claimed in claim 13 wherein the first conductive layer on the major surface of the optically transparent substrate includes a layer of indium-tin oxide.

15. An integrated electro-optical package as claimed in claim 13 wherein the at least one layer of organic material on the first conductive layer includes one of a layer of polymer and a layer of low molecular weight organic compound.

16. An integrated electro-optical package as claimed in claim 10 including in addition a lens system positioned substantially coextensive the central portion of the mounting substrate for magnifying the complete images generated by the array of light emitting devices of the first light emitting device display chip and the at least one additional light emitting device display chip and producing a virtual image perceivable by a human eye.

17. An integrated electro-optical package as claimed in claim 16 wherein the lens system positioned substantially coextensive with the complete image generated by the first light emitting device display chip and the complete image generated by the at least one additional light emitting device display chip is molded into the central portion of the mounting substrate.

18. An integrated electro-optical package as claimed in claim 16 wherein the lens system positioned substantially coextensive with the central portion of the mounting substrate, is mounted to the mounting substrate on a side of the mounting substrate opposite a mounting of the first light emitting device display chip and the at least one additional light emitting device display chip.

19. An integrated electro-optical package as claimed in claim 10 further comprised of a plurality of electrical conductors formed on the major surface of the optically transparent substrate of the first light emitting device display chip and the at least one additional light emitting device display chip, positioned to fan out from the array of light emitting devices to the plurality of external connection pads on the major surface of the optically transparent substrate, the plurality of external connection pads further being positioned in rows and columns on the major surface thereof.

20. A portable electronic device with visual display comprising:

a portable electronic device having a data output terminal; and a display including a first two dimensional array of light emitting devices designed to emit light at a first wavelength, arranged in rows and columns, and a data input connected to the data output terminal of the portable electronic device to utilize received data from the portable electronic device to define complete images on the first two dimensional array, and a second two dimensional array of light emitting devices designed to emit light at a second wavelength different than the first wavelength, arranged in rows and columns and coupled to a plurality of controls of the portable electronic device to provide visual images of control functions.

21. A portable electronic device with visual display as claimed in claim 20 wherein the first two dimensional array of light emitting devices and the second two dimensional array of light emitting devices include organic electroluminescent elements on a glass substrate.

22. A portable electronic device with visual display as claimed in claim 20 wherein the light emitting devices of the first two dimensional array of light emitting devices are constructed to emit light in a red/orange range and the light emitting devices of the second two dimensional array of light emitting devices are constructed to emit light in a blue/green range.

23. A portable electronic device with visual display as claimed in claim 20 wherein the portable electronic device includes portable communications equipment.

24. A portable electronic device with visual display as claimed in claim 23 wherein the portable communications equipment is one of a cellular telephone, a two-way radio, a data bank and a pager.

25. A portable electronic device with visual display as claimed in claim 20 further comprising:

a first electrode and a second electrode for activating each of the light emitting devices, the first two dimensional array of light emitting devices and the second two dimensional array of light emitting devices further having a plurality of external connection pads adjacent outer edges thereof and outside of a central portion of a major surface with the first electrode of each of the light emitting devices of the first two dimensional array of light emitting devices and the second two dimensional array of light emitting devices being connected to a first plurality of the plurality of external connection pads defining rows of pixels and the second electrode of each of the light emitting devices of the first two dimensional array of light emitting devices and the second two dimensional array of light emitting devices being connected to a second plurality of the plurality of external connection pads defining columns of pixels;

a mounting substrate, defining an optically transparent central portion, substantially coextensive with the first two dimensional array of light emitting devices and the second two dimensional array of light emitting devices, having a first major surface and a second opposed major surface with a plurality of first and second electrical connection pads on the first major surface, a plurality of electrical connections formed in the mounting substrate between the plurality of first and second electrical connection pads, the first and second two dimensional arrays of light emitting devices being mounted on the first major surface of the mounting substrate with the first electrical connection pads in electrical contact with the first and second pluralities of external connection pads of the first and second two dimensional arrays of light emitting devices;

a driver substrate having a first major surface and a second opposed major surface with a first plurality of electrical connection pads formed on the first major surface, a second plurality of electrical connection pads formed on the second opposed major surface and electrical connections formed in the driver substrate between the first and second pluralities of electrical connection pads, the mounting substrate being mounted on the first major surface of the driver substrate with the first plurality of electrical connection pads of the driver substrate in electrical contact with the second plurality of electrical connection pads on the mounting substrate;

a plurality of driver and controller circuits having a plurality of data input terminals connected to the data output terminal of the electronic device and further having a plurality of control signal output terminals adapted to be connected to the first electrode and second electrode of each of the light emitting devices of the first and second two dimensional arrays of light emitting devices to generate a complete image in accordance with data signals applied to the plurality of data input terminals, the plurality of driver and controller circuits being mounted on the second opposed major surface of the driver substrate with a control signal output terminal electrically contacting the plurality of second electrical connection pads on the second opposed major surface of the driver substrate; and a lens system positioned in the electronic device and axially aligned with the central portion of the mounting substrate for defining an aperture and providing a virtual image from the complete image generated by each of the array of light emitting devices of the first and second two dimensional arrays of light emitting devices, the virtual image being easily viewable by an operator of the electronic device.

26. A portable electronic device with visual display as claimed in claim 25 wherein the lens system is designed to magnify the complete image generated by each of the first and second two dimensional array of light emitting devices and produce a virtual image perceivable by a human eye.

27. A method of fabricating an electro-optical package comprising the steps of:

forming a first light emitting device display chip comprised of a plurality of light emitting devices on a major surface of an optically transparent substrate, each of the plurality of light emitting devices having a first electrode and a second electrode for activating each of the light emitting devices, the plurality of light emitting devices defining a plurality of pixels positioned in rows and columns and cooperating to generate a complete image, when activated, at a central portion of the major surface, the optically transparent substrate further being formed with external connection pads adjacent outer edges thereof and outside of the central portion of the major surface with the first electrode of each of the plurality of light emitting devices being connected to a first plurality of the external connection pads defining rows of pixels and the second electrode of each of the plurality of light emitting devices being connected to a second plurality of the external connection pads defining columns of pixels;

forming at least one additional light emitting device display chip comprised of a plurality of light emitting devices on a major surface of an optically transparent substrate constructed to emit light of a wavelength different than the light emitting devices of the first light emitting device display chip, each of the light emitting devices having a first electrode and a second electrode for activating each of the light emitting devices, the light emitting devices defining a plurality of pixels positioned in rows and columns and cooperating to generate a complete image, when activated, at a central portion of the major surface, the optically transparent substrate further being formed with external connection pads adjacent outer edges thereof and outside of the central portion of the major surface with the first electrode of each of the light emitting devices being connected to a first plurality of the external connection pads defining rows of pixels and the second electrode of each of the light emitting devices being connected to a second plurality of the external connection pads defining columns of pixels;

forming a mounting substrate with a first major surface and a second opposed major surface and forming a plurality of first electrical connection pads and a plurality of second electrical connection pads on the first major surface, and a plurality of electrical connections in the mounting substrate between the plurality of first and second electrical connection pads;

forming a driver substrate with a first major surface and a second opposed major surface and forming a plurality of first electrical connection pads on the first major surface, a plurality of second electrical connection pads on the second opposed major surface and electrical connections in the driver substrate between the first and second pluralities of electrical connection pads;

forming a plurality of driver and controller circuits having a plurality of data input terminals and further having a plurality of control signal output terminals adapted to be connected to the first electrode and the second electrode of each of the light emitting devices of the first light emitting device display chip and the at least one additional light emitting device display chip for activating each of the light emitting devices to generate images in accordance with a plurality of plurality of data signals applied to the data input terminals;

mounting the optically transparent substrate on the first major surface of the mounting substrate with the first plurality of electrical connection pads of the mounting substrate in electrical contact with the first plurality of the plurality of external connection pads and the second plurality of the plurality of external connection pads of the optically transparent substrate;

mounting the driver substrate on the mounting substrate with the plurality of first electrical connection pads of the driver substrate in electrical contact with the plurality of second electrical connection pads of the mounting substrate; and mounting the plurality of driver and controller circuits on the second opposed major surface of the driver substrate with the plurality of control signal output terminals electrically contacting the plurality of second electrical connection pads of the driver substrate.

28. A method of fabricating an electro-optical package as claimed in claim 27 wherein the steps of forming the first light emitting device display chip and the at least one additional light emitting device display chip includes forming the first light emitting device display chip so that it emits light in a red/orange range and forming the at least one additional light emitting device display chip so that it emits light in a blue/green range.

29. A method of fabricating an electro-optical package as claimed in claim 27 wherein the step of forming a plurality of light emitting devices on the major surface of an optically transparent substrate includes forming a plurality of light emitting devices on a glass substrate.

30. A method of fabricating an electro-optical package as claimed in claim 29 wherein the step of forming a plurality of light emitting devices on the major surface of an optically transparent substrate includes forming organic electroluminescent elements on the glass substrate.

31. A method of fabricating an electro-optical package as claimed in claim 30 wherein the step of forming a plurality of organic electroluminescent elements on the glass substrate includes the steps of depositing a first conductive layer on a major surface of the glass substrate, depositing at least one layer of organic material on the first conductive layer, and depositing a second conductive layer on the at least one layer of organic material.

32. A method of fabricating an electro-optical package as claimed in claim 31 wherein the step of depositing a first conductive layer on a major surface of the glass substrate includes depositing a layer of indium-tin oxide.

33. A method of fabricating an electro-optical package as claimed in claim 31 wherein the step of depositing at least one layer of organic material on the first conductive layer includes depositing one of a layer of polymer and a layer of low molecular weight organic compound.

* * * * *